(12) United States Patent
Hirata et al.

(10) Patent No.: US 6,894,371 B2
(45) Date of Patent: May 17, 2005

(54) SEMICONDUCTOR DEVICE

(75) Inventors: Koichi Hirata, Ashikaga (JP); Osamu Isaki, Ora-gun (JP); Tsutomu Aono, Tatebayashi (JP); Toshikazu Hirai, Ora-gun (JP); Tetsuro Asano, Ora-gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/359,251

(22) Filed: Feb. 6, 2003

(65) Prior Publication Data

US 2003/0164536 A1 Sep. 4, 2003

(30) Foreign Application Priority Data

Feb. 27, 2002 (JP) ........................................ 2002-050940

(51) Int. Cl.⁷ ............................................. H01L 23/495
(52) U.S. Cl. ........................................ 257/666; 257/676
(58) Field of Search ................................ 257/666, 676, 257/659, 691

(56) References Cited

U.S. PATENT DOCUMENTS

| | | | | |
|---|---|---|---|---|
| 5,479,050 A | * | 12/1995 | Pritchard et al. | |
| 5,521,431 A | * | 5/1996 | Tahara | |
| 5,859,387 A | * | 1/1999 | Gagnon | 174/52.2 |
| 5,977,619 A | * | 11/1999 | Uemura | 257/676 |
| 6,242,801 B1 | * | 6/2001 | Sano | |
| 6,288,441 B1 | * | 9/2001 | Corisis | 257/676 |
| 6,531,765 B2 | * | 3/2003 | Kinsman | |
| 6,627,977 B1 | * | 9/2003 | Foster | 257/666 |
| 2001/0002723 A1 | * | 6/2001 | Nishimura | 257/666 |
| 2003/0127711 A1 | * | 7/2003 | Kawai et al. | 257/666 |

OTHER PUBLICATIONS

"Switch MMIC for Bluetooth" from *Denshi Zainyo*; c. Nov. 2000.
"SANYO Technical Report" vol. 29, No. 1; c. Apr. 1997.

* cited by examiner

*Primary Examiner*—S. V. Clark
(74) *Attorney, Agent, or Firm*—Morrison & Foerster LLP

(57) ABSTRACT

In a case of a semiconductor chip having an electrode pad to be wire-bonded to a header, securing of a fixing region is difficult since the spread of an Ag paste cannot be controlled, therefore, there has existed a problem such that stable manufacturing could not be carried out. Also, there existed a problem such that realization of stable manufacturing resulted in an excessively large external package form. A projection part is provided in a header, and a fixing region of a bonding wire is secured by arranging a chip at a position shifted in a direction to become distant from the projection part. An electrode pad to be connected to the header is arranged closer to the chip center than the other electrode pads of the identical chip side, and a wire is extended therefrom to the projection part or in the vicinity thereof so as to cross the chip and is fixed. Thereby, downsizing of the package and stable manufacturing are realized.

10 Claims, 7 Drawing Sheets

SEMICONDUCTOR DEVICE

BACKGROUND OF THE INVENTION

1. Field of the Invention

The invention relates to a semiconductor device and, specifically to a semiconductor device with a reduced package size.

2. Description of the Related Art

Mobile communication devices such as mobile telephones often utilize microwaves in the GHz range, and commonly use switching devices for high frequency signals which are used in switching circuits for changing antennas and switching circuits for transmitting and receiving such signals (for example, Japanese Laid-Open Patent Application No. Hei 9-181642). Such a device often uses a field effect transistor (hereinafter referred to as an FET) based on gallium arsenide (GaAs) as high frequencies are used with the device. Accordingly, efforts have been made in developing a monolithic microwave integrated circuit (MMIC) by integrating the aforementioned switching circuits and in developing an integrated circuit for a mixer use which realizes low distortion and a broadband operation.

FIG. 1 is a top view of a conventional semiconductor device that includes a semiconductor chip 41 mounted on a frame, which features two switching FETs and two shunt FETs. In this configuration, the chip size has been reduced to its minimum (0.55 mm×0.5 mm) that is allowed by current engineering capabilities. The semiconductor chip 41 is mounted on a header 80 of the frame using a conductive adhesive such as a Ag paste 85 or a non-conductive adhesive. Pad electrodes on the chip 41 are connected to corresponding leads, respectively, by bonding wires 80 radially extending from the chip 41. In particular, a capacity terminal electrode pad CP is wire-bonded to the header and is thereby connected to the capacity terminal C.

In this configuration, however, the spread of the Ag paste for mounting the chip cannot be easily controlled. Although the spread of the Ag paste in FIG. 1 is under good control, it is likely that some portion of the paste extend toward the edge of the header. Because it is difficult to fix a bonding wire to a header surface covered by the paste, a large margin should be created around the chip for stable wire bonding to the header. Accordingly, even though the ship size has been reduced to the minimum, the package size has not been reduced accordingly because of the large margin necessary for wire bonding.

SUMMARY OF THE INVENTION

The invention provides a semiconductor device that includes a frame having a header and a plurality of leads, and a projection part extending from the header and penetrating into a space between two of the leads. The device also includes a semiconductor chip mounted on the header and having a plurality of electrode pads, and a bonding wire, one end of which is fixed to one of the electrode pads, another end of which is fixed to the projection part or the header adjacent the projection part.

The invention also provides a semiconductor device that includes a frame having a header and a plurality of leads, and a projection part extending from the header and penetrating into a space between two of the leads. The device also includes a semiconductor chip having a switch circuit that includes two field effect transistors, one input terminal electrode pad, one control terminal electrode pad, two output terminal electrode pads and one of a ground terminal electrode pad and a capacity terminal electrode pad. The semiconductor chip also has a plurality of electrode pads. The device also includes a bonding wire, one end of which is fixed to the ground terminal electrode pad or the capacity terminal electrode pad, another end of which is fixed to the projection part or the header adjacent the projection part.

The invention further provides a semiconductor device that includes a frame having a header and two leads, and a projection part extending from the header and penetrating into a space between the leads. The header and the projection part substantially receive a DC voltage. The device also includes a semiconductor chip mounted on the header and having an electrode pad. One of the two leads communicates a high frequency signal. The device further includes a bonding wire, one end of which is fixed to the electrode pad, another end of which is fixed to the projection part or the header adjacent the projection part. The projection part is configured to shield the lead communicating the high frequency signal from other portion of the semiconductor device.

DETAILED DESCRIPTION OF THE INVENTION

The invention will be described with reference to FIGS. 2A through 7B.

Figure 2A:
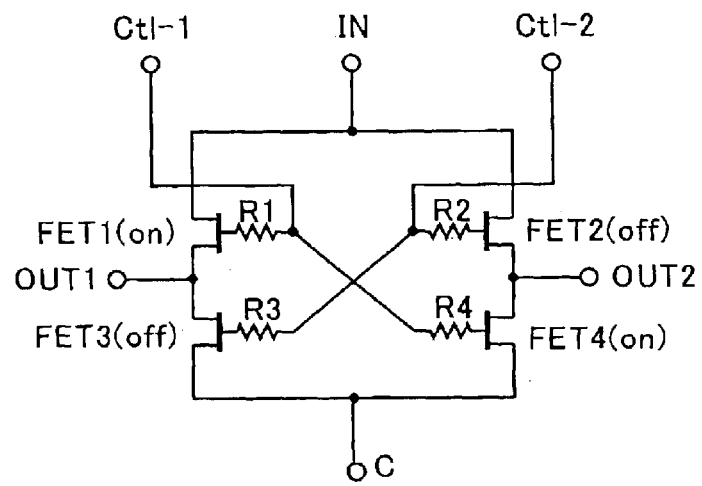
FIG. 2A is a circuit diagram of a semiconductor switch of a first embodiment of the invention.

FIG. 2A is a circuit diagram of a compound semiconductor switching circuit device of a first embodiment of the invention. In this circuit, between two output terminals, OUT1 and OUT2, of two FETs, FET1 and FET2, and a ground, shunt FETs, FET3 and FET4, are connected. A pair of complementary signals are applied to gates of these shunt FETs, FET3 and FET4, through control terminals, Ctl-2 and Ctl-1, that also applies the complementary signals to the gates of switch FETs, FET1 and FET2. As a result, when FET1 is on, the shunt FET4 is also on, and FET2 and the shunt FET3 are off.

In this circuit, when a signal path from the common input terminal IN to the output terminal OUT1 is turned on and a signal path from the common input terminal IN to the output terminal OUT2 is turned off, the input signals leaking into the output terminal OUT2 is released to the ground via a grounded capacitor (not shown), as the shunt FET4 is on. Accordingly the signal leakage is prevented and isolation characteristics of the device is improved.

Figure 2B:
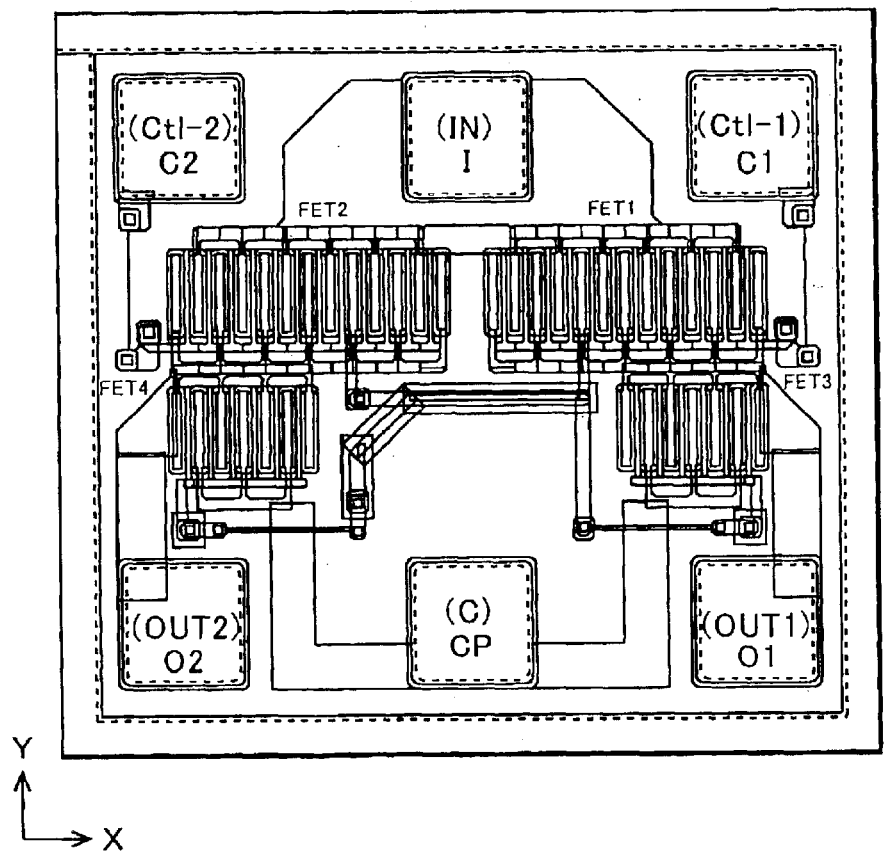
FIG. 2B is a semiconductor chip of the first embodiment based on the circuit of FIG. 2A.

In this embodiment, the ground capacitor is external to the semiconductor chip. A capacitor terminal electrode pad CP of the chip, shown in FIG. 2B, is connected to the external ground capacitor through a capacitor terminal C shown in FIG. 3. The semiconductor chip may include the ground capacitor and in this case the capacitor terminal pad CP may serve as a ground terminal electrode pad.

FIG. 2B shows an example of a compound semiconductor chip based on the circuit design of FIG. 2A. On a GaAs substrate that is semi-insulating, the switching FETs, FET1 and FET2, are arranged in right and left at the central portion of the device, and shunt FETs, FET3 and FET4, are arranged in the vicinities of the right and left lower corners. Resisters R1, R2, R3, and R4 are connected to gate electrodes of the respective FETs. In addition, electrode pads I, O1, O2, C1, C2, and CP, which correspond to a common input terminal IN, output terminals OUT1 and OUT2, control terminals Ctl-1 and Ctl-2, and the capacitor terminal C, are provided near the edges of the substrate. Furthermore, source electrodes of the shunt FETs, FET3 and FET4, are connected to each other and are connected to the capacitor terminal C, which is further connected to the ground through the ground capacitor.

Figure 3:
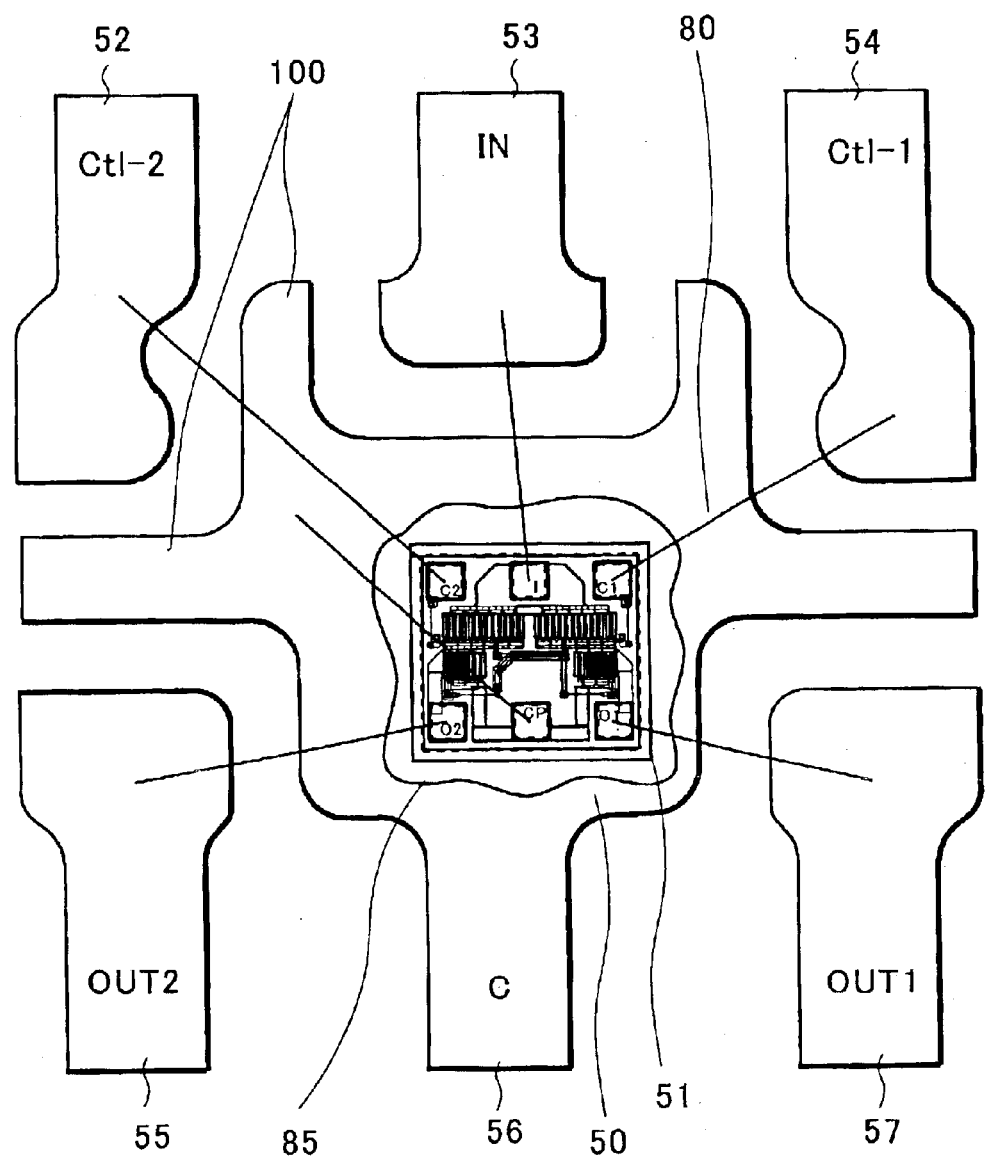
FIG. 3 is a semiconductor device of the first embodiment in which the chip of FIG. 2A is mounted on a frame.
Figure 3:
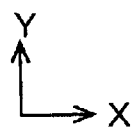

FIG. 3 shows a compound semiconductor device of the first embodiment, in which the semiconductor chip of FIG. 2B is mounted on a frame. As shown in FIG. 3, this embodiment uses a six-pin frame. A header 50 is located in the center of the frame to receive the compound semiconductor chip 51. Three leads 52, 53, and 54 aligned along one end of the chip are connected to electrode pads C2, I, and C1 for a control terminal Ctl-2, a common input terminal IN, and a control terminal Ctl-1 via bonding wires 80, respectively. Two leads 55 and 57 aligned along the other end are connected to electrode pads O2 and O1 for an output terminal OUT2 and an output terminal OUT1 via bonding wires, respectively. Furthermore, a central lead 56 extends to the header 50 and is connected to a capacity terminal electrode pad CP of the compound semiconductor chip 51 via a bonding wire.

Projection parts extends from a header 50 and penetrate into a space between two leads. The capacity terminal electrode pad CP is connected via a bonding wire to the projection part 100 extending from the header 50. The bonding wire may also be fixed on the header at a vicinity of the projection part 100. Such a connection of the bonding wire to the header is possible because the projection part provides extra support for wire bonding at the edge of the header.

Furthermore, the compound semiconductor chip 51 is mounted off the center of the header 50 and is located at a position shifted away from the projection part 100 that receives the bonding wire so that a space between the bonding wire connected to the header 50 and bonding wires on both sides thereof can be sufficiently secured.

Figure 1:
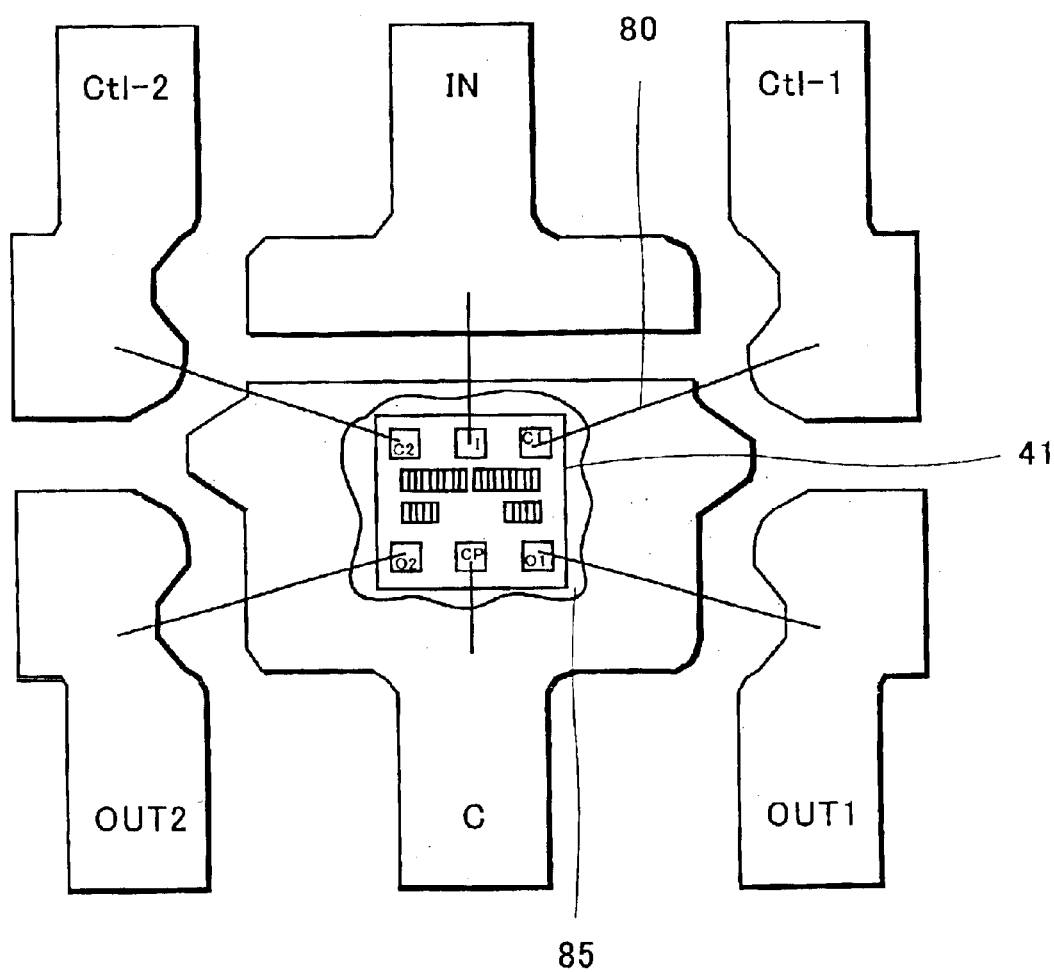
FIG. 1 is a top view of a conventional semiconductor device that includes a semiconductor chip mounted on a frame.

In the conventional device of FIG. 1, all the bonding wires extend radially from the respective electrode pads to the corresponding leads located outside the chip. However, in this embodiment, the bonding wire connected to the capacity terminal electrode pad CP travels over the chip to reach the projection part 100.

Accordingly, the above configuration provides stable wire bonding at the projection part even though the width (X direction) of the header is smaller than the with of the conventional header of FIG. 1. In this configuration, the projection part itself provides a space and margin for stable wire bonding, and the header does not have to provide the margin for bonding as in the case of the conventional device of FIG. 1. That is, even if an Ag paste 85 spreads on the header, wire bonding can be provided on the projection part or in the vicinity of the projection part where a stable bonding is secured. Therefore, the header is reduced in size and package size reduction is realized. Thus, stable manufacturing of the semiconductor device is achieved.

In this embodiment, a plurality of projection parts are configured to penetrate into a space between respective leads. The lead 56, which serves as a capacity terminal C, and projection parts are grounded via an external ground capacitor. The leads 54 and 52 connected to the control terminals Ctl-1 and Ctl-2 receive DC voltages which serve as a ground voltage for high frequency signals. By arranging the leads and the projection parts, which are at substantially at a ground level (reference level) for high frequency signals, between the lead 53 of the common input terminal IN, the lead 57 of the output terminal OUT1, and the lead 55 of the output terminal OUT2, isolation characteristics between the respective high-frequency signal terminals IN, OUT1, and OUT2 are improved. Although the device of this embodiment has four projection portions, the device may have just one projection part to secure a stable wire bonding connection.

Figure 4A:
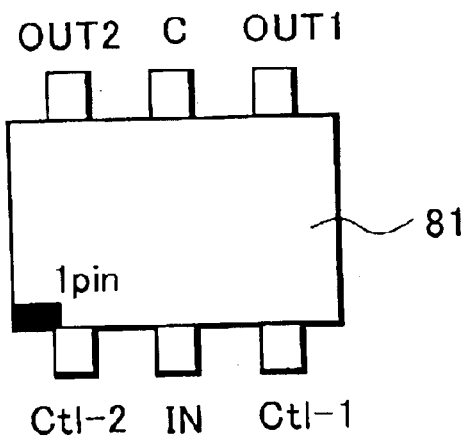
FIG. 4A is a top view of a packaging of the first embodiment.
Figure 4B:
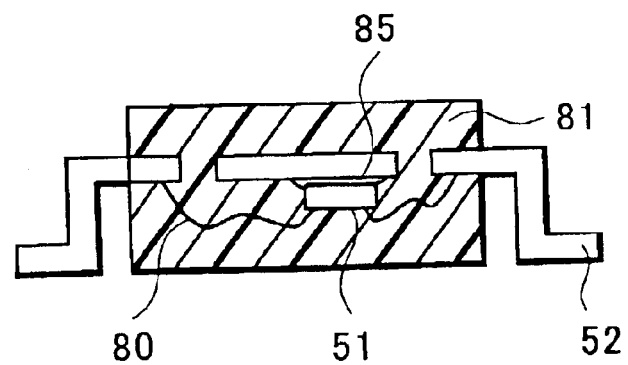
FIGS. 4B and 4C are side views of the packaging of FIG. 4A.
Figure 4C:
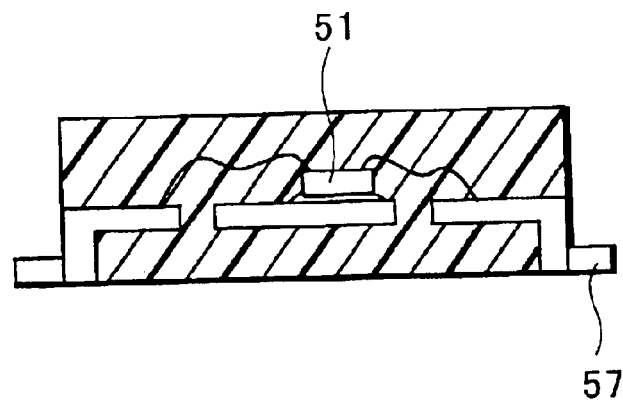

FIG. 4A is a plan view of the device of FIG. 3 after molding process for packaging, and FIGS. 4B and 4C show cross-sectional views of molded device of FIG. 4A. The chip 51 is fixed to the header by a conductive paste 85 or a non-conductive paste, and is covered by a resin layer 81 formed by transfer molding with the far ends of the respective leads 52, 53, 54, 55, 56, and 57 exposed. This package is called MCP6 and is smaller in size at 2.0 mm×2.1 mm×0.9 mm than the conventional packaging of FIG. 1 which houses the same chip of FIG. 2B and is as large as 2.9 mm×2.8 mm×1.1 mm.

Furthermore, since the wire connected to the projection part requires a certain length, by arranging the wire as an M-shaped loop as shown in FIGS. 4B and 4C, the height can be suppressed even with a long wire, thus contributing to a reduction in the thickness of the packaging.

In addition, as shown in FIG. 4C, the chip may be mounted on the frame so as to face the opposite direction. This is called MCPH6 and is identical to MCP6 in terms of size including the front-end leads, although its resin mold is wider than that of MCP6.

In this embodiment, the chip is mounted off the center of the header However, the chip may be mounted on any position including the center as long as a sufficient surface can be secured for wire bonding. In addition, the electrode pad to be fixed to the header is not limited to a capacity terminal electrode pad and may be any electrode pad. For example, in the circuit diagram of FIG. 2A, the external capacity terminal C may be directly grounded without fitting an external capacity thereto so that the terminal becomes a ground terminal. In this case the control signals should be 0/−3V while control signals applied to the switch FETs with an external ground capacitor should be 0/+3V.

Figure 5A:
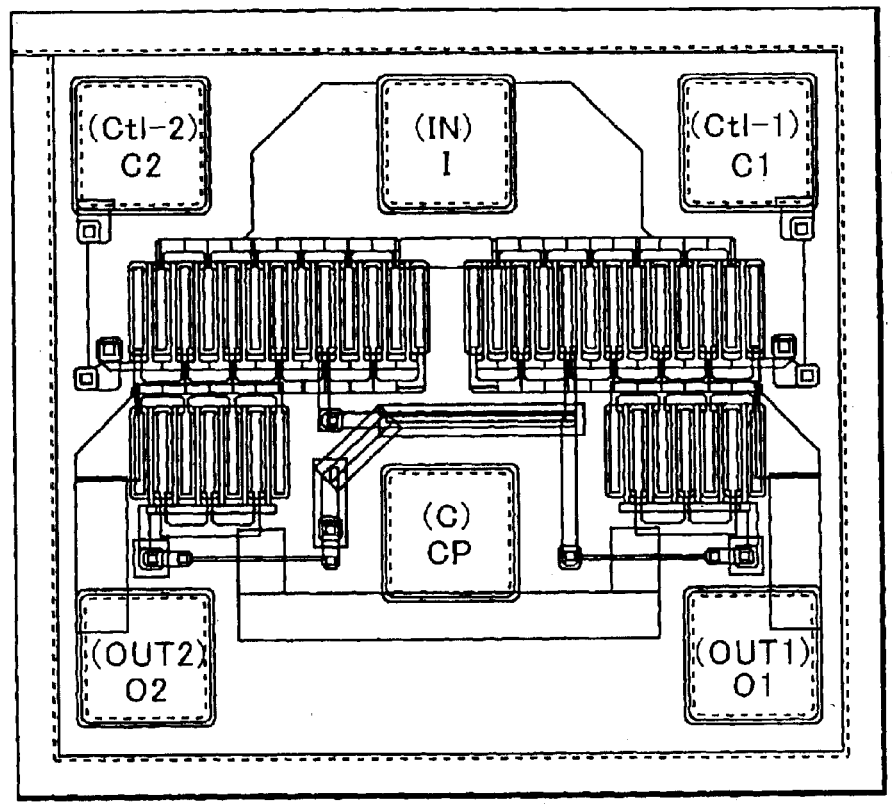
FIG. 5A is a semiconductor chip of a second embodiment of the invention.
Figure 5B:
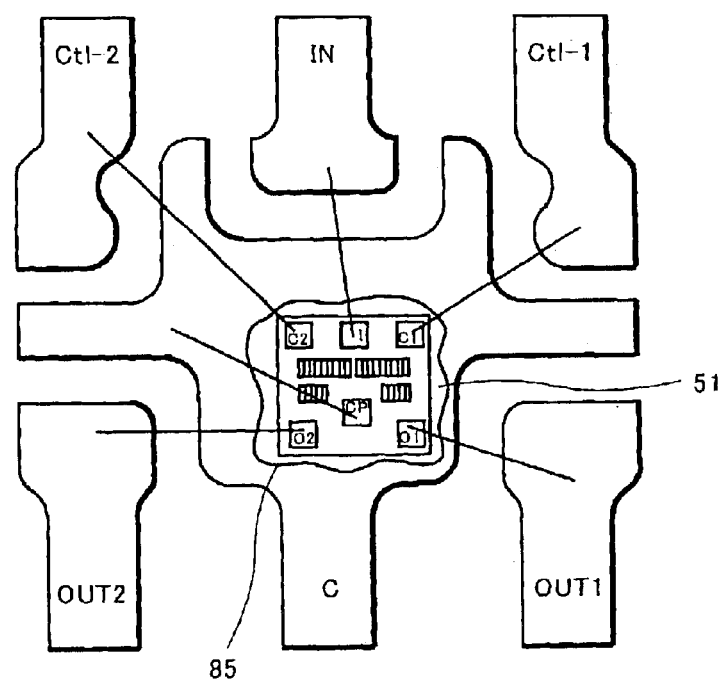
FIG. 5B is a semiconductor device of the second embodiment in which the chip of FIG. 5A is mounted on a frame.

FIGS. 5A and 5B show a second embodiment of this invention. In this configuration, the electrode pad connected to the projection portion is not aligned with other two electrode pads along a chip side, but is located closer to the chip center than other electrode pads on the same side. The semiconductor chip of FIG. 5A is substantially identical in the structure to the chip of FIG. 2A except that the capacity terminal electrode pad CP is closer to the chip center. Thereby, as in FIG. 5B, since a longer range of angle is available for wire bonding between the electrode pad CP and the projection part, bonding positioning is more flexible. Thus failures during wire bonding can be considerably reduced.

Furthermore, because the distance between the bonding wire and the terminal electrode pads O2, which is adjacent the capacity terminal electrode pad CP, the insertion loss is suppressed.

Figure 6A:
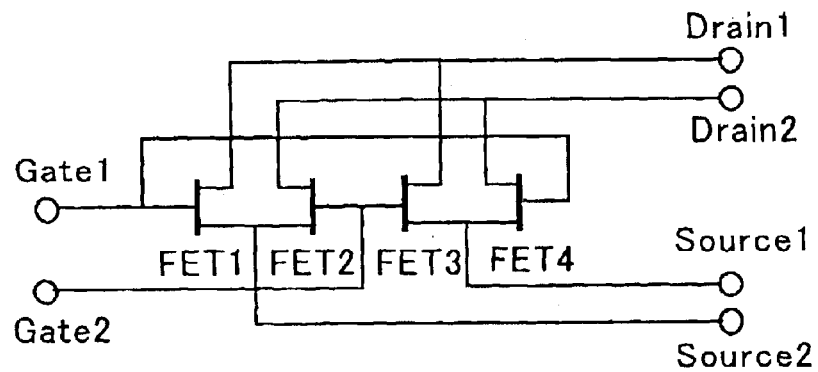
FIG. 6A is a circuit diagram of a semiconductor mixer of a third embodiment of the invention.

A third embodiment of the invention includes a device for uses as a mixer employing GaAs FETs. FIG. 6A shows a circuit diagram of a mixer integrated circuit device. Gate electrodes of the first FET1 and fourth FET4 are connected to a gate terminal Gate1, and gate electrodes of the second FET2 and third FET3 are connected to a gate terminal Gate2. In addition, source electrodes (or drain electrodes) of the first FET1 and second FET2 are connected to a source terminal Source2, and source electrodes (or drain electrodes) of the third FET3 and fourth FET4 are connected to a source terminal Source1. Furthermore, drain electrodes (or source electrodes) of the first FET1 and third FET3 are connected to a drain terminal Drain1, and drain electrodes (or source electrodes) of the second FET2 and fourth FET4 are connected to a drain terminal Drain2.

This mixer integrated circuit device carries out frequency conversion, and the mixer IC of this circuit configuration is called a double balanced mixer. RF signals, LO signals, and IF signals are respectively provided as a pair of signals with phases having 180° difference created by an external balun. Therefore, an even-order harmonics is suppressed. In particular, this is best suited for high-frequency digital radio communications by a mobile communications apparatus where low distortion is required. Furthermore, since the device can be used in a broad frequency band, this is best suited for use as a CATV tuner mixer. In the operation, RF signals are inputted into a source terminal Source1 and a source terminal Source2, LO signals are inputted into a gate terminal Gate1 and a gate terminal Gate2, and IF signals are taken out from a drain terminal Drain1 and a drain terminal Drain2.

Figure 6B:
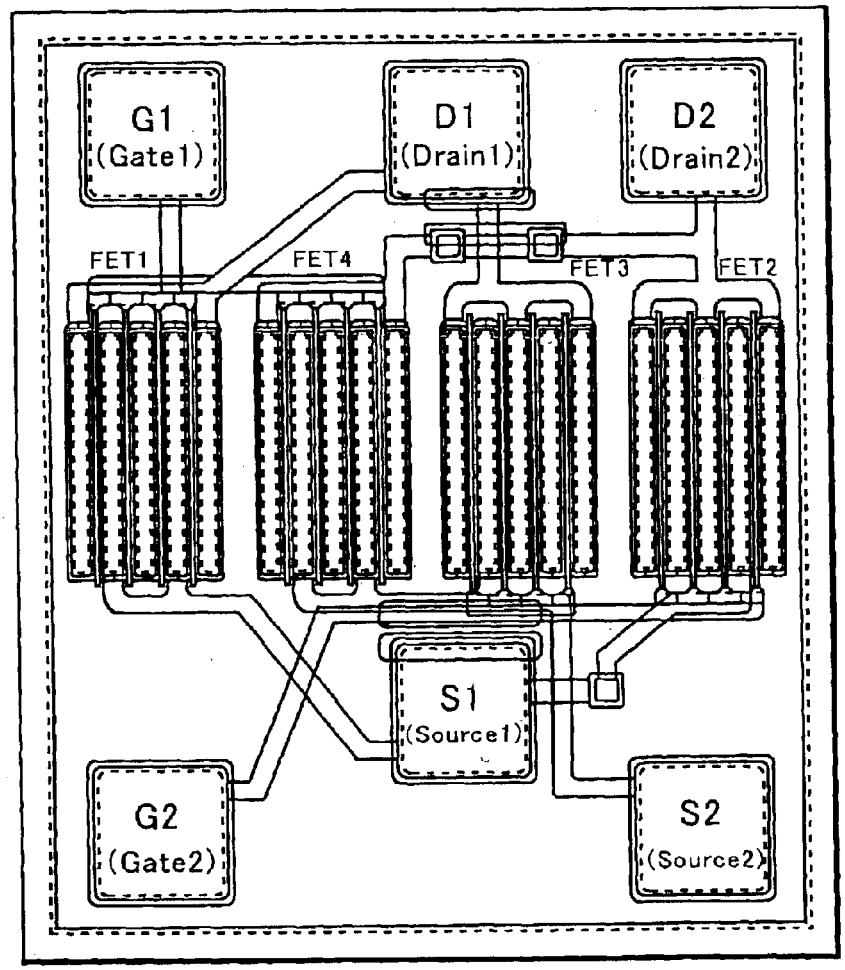
FIG. 6B is a semiconductor chip of the third embodiment based on the circuit of FIG. 6A.

FIG. 6B shows an example of a compound semiconductor chip in which the compound semiconductor mixer circuit shown in FIG. 6A is integrated.

FET1, FET2, FET3, and FET4 are arranged in the central part of a GaAs substrate. In addition, electrode pads G2 and S2 which respectively correspond to a gate terminal Gate2 and a source terminal Source2 are aligned along one side of the chip, and a source terminal Source 1 electrode pad S1 to be connected to a header is arranged closer to the chip center than these two electrode pads. Electrode pads G1, D1, and D2 which correspond to a Gate terminal Gate1, drain terminal Drain1, and a drain terminal Drain2 are aligned along the opposed side of the chip.

As shown in FIG. 6B, two of the four FETs share one source electrode, one drain electrode and one gate electrode, respectively. The FETs are connected to two gate terminal electrode pads, G1 and G2, two source terminal electrode pads, S1 and S2, and two drain terminal electrode pads, D1 and D2.

Figure 7A:
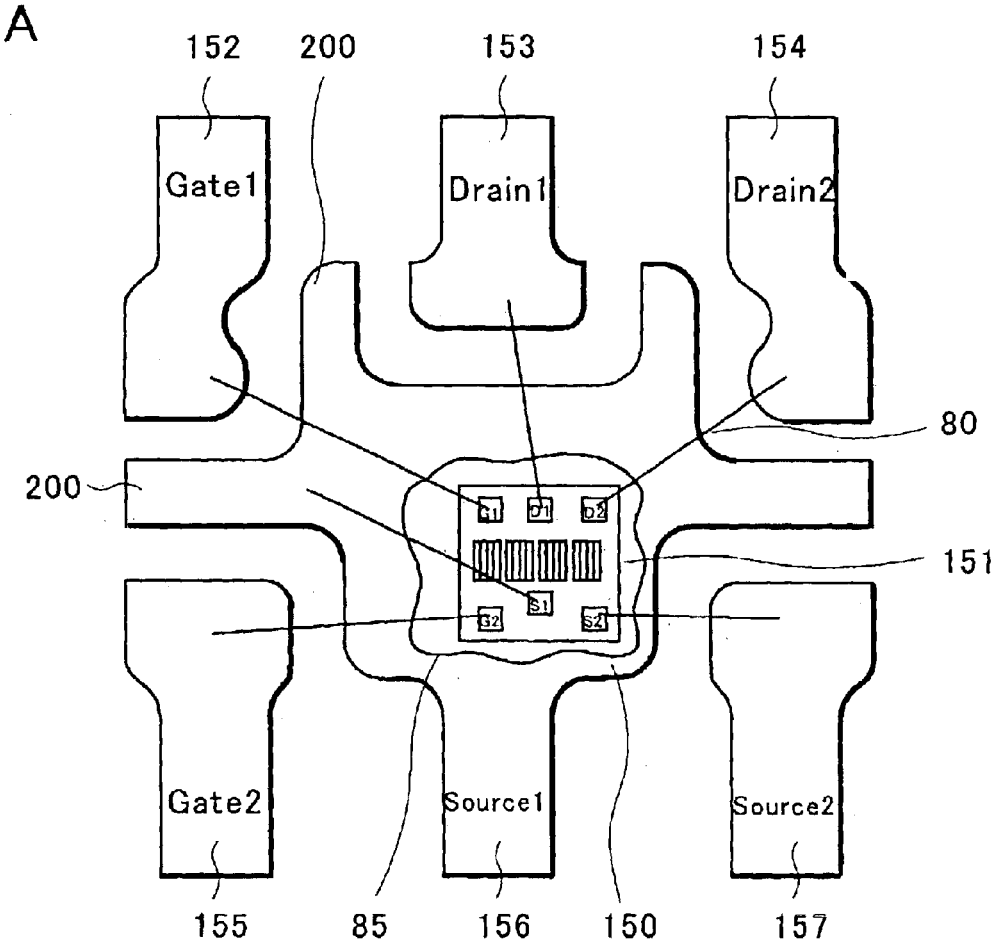
FIG. 7A is a semiconductor device of the third embodiment in which the chip of FIG. 6B is mounted on a frame.
Figure 7B:
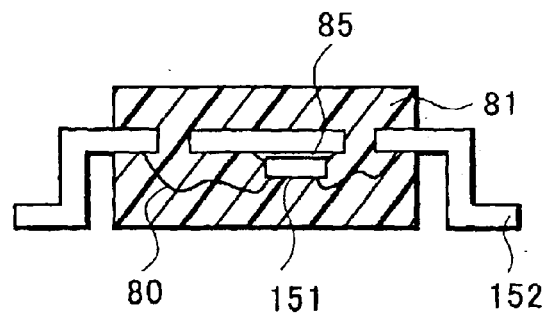
FIG. 7B is a side view of a packaging of the third embodiment.

FIGS. 7A and 7B show the chip of FIG. 6B is mounted on a frame. As shown in FIG. 7A, the frame has six-pins leads, and a header 150 is located in the central portion of the frame. A compound semiconductor chip 151 is mounted on the header 150. Three leads 152, 153, and 154 aligned along one end of the chip are connected to a gate terminal electrode pad G1, a drain terminal electrode pad D1, and a drain terminal electrode pad D2 of the compound semiconductor chip 151 via bonding wires, respectively. In addition, two leads 155 and 157 aligned along the other end are connected to a gate terminal electrode pad G2 and a source terminal electrode pad S2 of the compound semiconductor chip 151 via bonding wires, respectively. Furthermore, a central lead 156 extends from the header 150 and is connected to a capacity terminal electrode pad S1 of the compound semiconductor chip 151.

A projection part 200 extends from the header and penetrates into a space between the leads. A bonding wire connected to the source terminal electrode pad S1 is fixed to this projection part or in the vicinity of the projection part.

The compound semiconductor chip is mounted away from the center of the header and away from the projection part so that a space enough for wire bonding to the projection part is secured between the bonding wires fixed adjacent the bonding wires connected to the projection part. As is the case with the first embodiment, in this configuration the projection part provides a space and margin for stable wire bonding without having to provide the large margin space in the header for securing stable wire bonding. Accordingly, the width of the header is reduced and thus the packaging size is reduced as well. Furthermore, as is the with the second embodiment, the wire bonding to the projection part is flexible because of the positioning of the source terminal electrode pad S1.

In addition, as shown in FIG. 7B, the chip is covered by a resin layer 81 formed by transfer molding with the far ends of the respective leads 152, 153, 154, 155, 156, and 157 exposed. This package is called MCP6 and is smaller in size at 2.0 mm×2.1 mm×0.9 mm. Furthermore, as is the case with the first embodiment, the long bonding wires take the form of the M-shaped loop and contributes to the height reduction of the packaging.

The above mixer integrated circuit device has a chip size of 0.45×0.45 mm, which requires a packaging size as large as 2.9 mm×2.8 mm×1.1 mm according to the conventional packaging. Based on this invention, however, a frame identical to that of the switch circuit device of the first or second embodiment can be utilized for the mixer device. In other words, the device can be mounted in a small package such as MCP6 or MCPH6. Therefore, this can meet demands for use in a mobile-phone unit and a CATV tuner. Furthermore, the same frame may be used for the switch circuit device as well as the mixer circuit device to reduce overall production cost.

In the embodiments, a compound semiconductor device is described as an example. However, the invention also applies to a silicon semiconductor device as well.

What is claimed is:

1. A semiconductor device comprising:
   a header including a lead;
   a plurality of further leads separated from the header;
   a projection part extending from the header and penetrating into a space between two of the further leads;
   a semiconductor chip mounted on the header and having a plurality of electrode pads; and
   a bonding wire, one end thereof being fixed to one of the electrode pads, another end thereof being fixed to the projection part or the header adjacent the projection part, wherein the chip comprises a mixer integrated circuit including four field effect transistors, two gate terminal electrode pads, two source terminal electrode pads and two drain terminal electrode pads.

2. The semiconductor device of claim 1, wherein the electrode pad connected to the projection part or the header adjacent the projection part is one of the two source terminal electrode pads.

3. A semiconductor device comprising:

a header including a lead;

a plurality of further leads separated from the header;

a projection part extending from the header and penetrating into a space between two of the further leads;

a semiconductor chip comprising a switch circuit including two field effect transistors, one input terminal electrode pad, one control terminal electrode pad, two output terminal electrode pads and one of a ground terminal electrode pad and a capacity terminal electrode pad; and a bonding wire, one end thereof being fixed to said one of a ground terminal electrode pad and a capacity terminal electrode pad, another end thereof being fixed to the projection part or the header adjacent the projection part.

4. The semiconductor device of claim 1 or 3, wherein the semiconductor chip is mounted on the header off the center thereof so that the semiconductor chip is disposed away from the projection part.

5. The semiconductor device of claim 1 or 3, wherein the bonding wire extends over the semiconductor chip.

6. The semiconductor device of claim 1 or 3, wherein the electrode pad connected to the projection part or the header adjacent the projection part is disposed closer to the central portion of the semiconductor chip than other electrode pads disposed on a same side of the semiconductor chip as the electrode pad connected to the projection part or the header adjacent the projection part.

7. The semiconductor device of claim 1 or 3, wherein the bonding wire takes a form of an M-shaped loop.

8. The semiconductor device claim 1 or 3, wherein the semiconductor chip is mounted on the header using an adhesive.

9. The semiconductor device of claim 1 or 3, wherein the projection part is configured with respect to the further leads to serve as a ground at high frequency so as to improve isolation.

10. A semiconductor device comprising:

a header including a lead;

two further leads separated from the header;

a projection part extending from the header and penetrating into a space between the further leads, the header and the projection part substantially receiving a DC voltage;

a semiconductor chip mounted on the header and having an electrode pad, one of the two further leads communicating a high frequency signal; and a bonding wire, one end thereof being fixed to the electrode pad, another end thereof being fixed to the projection part or the header adjacent the projection part, wherein the projection part is configured to shield the further lead communicating the high frequency signal from another portion of the semiconductor device.

* * * * *